(12) United States Patent
Gossner et al.

(10) Patent No.: US 11,545,586 B2
(45) Date of Patent: Jan. 3, 2023

(54) GROUP III-NITRIDE SCHOTTKY DIODE (71) Applicant: INTEL CORPORATION, Santa Clara, CA (US)

(72) Inventors: Harald Gossner, Riemerling (DE); Peter Baumgartner, Hamburg (DE); Uwe Hodel, Putzbrunn (DE); Domagoj Siprak, Munich (DE); Stephan Leuschner, Munich (DE); Richard Geiger, Munich (DE); Han Wui Then, Portland, OR (US); Marko Radosavljevic, Portland, OR (US); Sansaptak Dasgupta, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/643,929

(22) PCT Filed: Sep. 29, 2017

(86) PCT No.: PCT/US2017/054630
§ 371 (c)(1),
(2) Date: Mar. 3, 2020

(87) PCT Pub. No.: WO2019/066972
PCT Pub. Date: Apr. 4, 2019

(65) Prior Publication Data
US 2020/0411699 A1    Dec. 31, 2020

(51) Int. Cl.
*H01L 29/872*    (2006.01)
*H01L 29/20*    (2006.01)
(Continued)

(52) U.S. Cl.
CPC ........ *H01L 29/872* (2013.01); *H01L 29/2003* (2013.01); *H01L 29/205* (2013.01); *H01L 29/66212* (2013.01)

(58) Field of Classification Search
CPC ............. H01L 29/872; H01L 29/66212; H01L 29/205
See application file for complete search history.

(56) References Cited

U.S. PATENT DOCUMENTS 8,680,564 B2    3/2014  Makino et al.
9,379,104 B1    6/2016  Wu
(Continued)

FOREIGN PATENT DOCUMENTS

JP    2014212151    11/2014
KR    20150063682    6/2015
(Continued)

OTHER PUBLICATIONS

European Search Report from European Patent Application No. 17927581.3 dated Mar. 30, 2021, 15 pgs.
(Continued)

*Primary Examiner* — Wasiul Haider
(74) *Attorney, Agent, or Firm* — Essential Patents Group, LLP (57) ABSTRACT

A Group III-Nitride (III-N) device structure is provided which comprises: a heterostructure having three or more layers comprising III-N material, an anode within a recess that extends through two or more of the layers, wherein the anode is in electrical contact with the first layer, a cathode comprising donor dopants, wherein the cathode is on the first layer of the heterostructure; and a conducting region in the first layer in direct contact to the cathode and conductively connected to the anode. Other embodiments are also disclosed and claimed.

18 Claims, 6 Drawing Sheets

(51) Int. Cl.
*H01L 29/66* (2006.01)
*H01L 29/205* (2006.01)

(56) References Cited

U.S. PATENT DOCUMENTS

| | | | |
|---|---|---|---|
| 9,607,978 | B2 | 3/2017 | Deval et al. |
| 9,825,026 | B2 | 11/2017 | Twynam |
| 2001/0023964 | A1 | 9/2001 | Wu et al. |
| 2004/0238842 | A1 | 12/2004 | Micovic et al. |
| 2006/0118822 | A1* | 6/2006 | Murata ............... H01L 29/7787 257/192 |
| 2007/0018199 | A1 | 1/2007 | Sheppard et al. |
| 2008/0203478 | A1 | 8/2008 | Prikhodko et al. |
| 2009/0146182 | A1 | 6/2009 | Hikita et al. |
| 2009/0267078 | A1 | 10/2009 | Mishra et al. |
| 2010/0140660 | A1* | 6/2010 | Wu ..................... H01L 29/2003 257/E29.338 |
| 2010/0207166 | A1 | 8/2010 | Zhu |
| 2010/0327322 | A1 | 12/2010 | Kub et al. |
| 2011/0127541 | A1 | 6/2011 | Wu et al. |
| 2011/0140172 | A1 | 6/2011 | Chu et al. |
| 2011/0147706 | A1 | 6/2011 | Radosavljevic et al. |
| 2011/0189837 | A1 | 8/2011 | Yu et al. |
| 2012/0223319 | A1 | 9/2012 | Dora |
| 2012/0223320 | A1* | 9/2012 | Dora ..................... H01L 29/778 257/E21.159 |
| 2013/0043484 | A1* | 2/2013 | Curatola ........... H01L 29/66431 257/E21.403 |
| 2013/0056744 | A1 | 3/2013 | Mishra et al. |
| 2013/0092958 | A1 | 4/2013 | Chen et al. |
| 2014/0054603 | A1 | 2/2014 | Wu et al. |
| 2014/0103357 | A1 | 4/2014 | Decoutere et al. |
| 2014/0110759 | A1 | 4/2014 | Murata et al. |
| 2014/0210007 | A1 | 7/2014 | Deval et al. |
| 2014/0231874 | A1 | 8/2014 | Hoshi et al. |
| 2015/0115139 | A1* | 4/2015 | Okushiba ............... G01S 7/4813 250/216 |
| 2015/0214327 | A1 | 7/2015 | Decoutere et al. |
| 2016/0071832 | A1* | 3/2016 | Yoo ...................... H01L 29/735 257/577 |
| 2016/0197203 | A1 | 7/2016 | Hu |
| 2016/0372634 | A1 | 12/2016 | Yoo et al. |
| 2017/0179115 | A1 | 6/2017 | Wang et al. |
| 2018/0374848 | A1 | 12/2018 | Baines et al. |
| 2019/0058049 | A1 | 2/2019 | Then et al. |
| 2019/0189441 | A1 | 6/2019 | Fujita et al. |
| 2020/0066890 | A1 | 2/2020 | Then et al. |
| 2020/0220036 | A1* | 7/2020 | Azize ............. H01L 31/035281 |

FOREIGN PATENT DOCUMENTS

| | | |
|---|---|---|
| KR | 101535852 | 7/2015 |
| KR | 20150114982 | 10/2015 |

OTHER PUBLICATIONS

Zhu, Mingda et al., "1.9-kV AlGaN/GaN Lateral Schottky Barrier Diodes on Silicon", IEEE Electron Device Letters, vol. 36,p. No. 4, Apr. 2015, 3 pgs.

Extended European Search Report from European Patent Application No. 17927581.3 dated Jun. 30, 2021, 13 pgs.

International Preliminary Report on Patentability from PCT/US2017/054630 dated Apr. 9, 2020, 8 pgs.

International Search Report and Written Opinion from PCT/US2017/054630 dated Jun. 29, 2018, 11 pgs.

* cited by examiner

GROUP III-NITRIDE SCHOTTKY DIODE

CLAIM OF PRIORITY

This Application is a National Stage Entry of, and claims priority to, PCT Application No. PCT/US2017/054630, filed on 29 Sep. 2017 and titled "GROUP III-NITRIDE SCHOTTKY DIODE", which is incorporated by reference in its entirety for all purposes.

BACKGROUND

Diodes are a common circuit element used in integrated circuits (ICs). Diodes are useful for protecting circuitry from over-voltages, such as those associated with electrostatic discharge (ESD) events. Absent a protection circuit, discharge through a device such as a transistor, can cause catastrophic damage to an IC. Diodic protection circuits may therefore be configured as part of a functional IC to shunt surges in potential away from circuitry that could otherwise be damaged. Group III-Nitride (IUPAC 13-N) semiconductor materials offer the benefit of a relatively wide bandgap (~3.4 eV), enabling higher breakdown voltages than Si-based devices. Group III-Nitride (III-N) semiconductor materials also offer high carrier mobility. However, III-N diodes with sufficiently low on-resistance tend to be an area-intensive circuit element even when monolithically integrated with transistors of an IC.

III-N diode structures enabling a smaller area are therefore advantageous at least for enabling dimensional scaling of the device platforms that employ them.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A. B and C.

Figure 1:
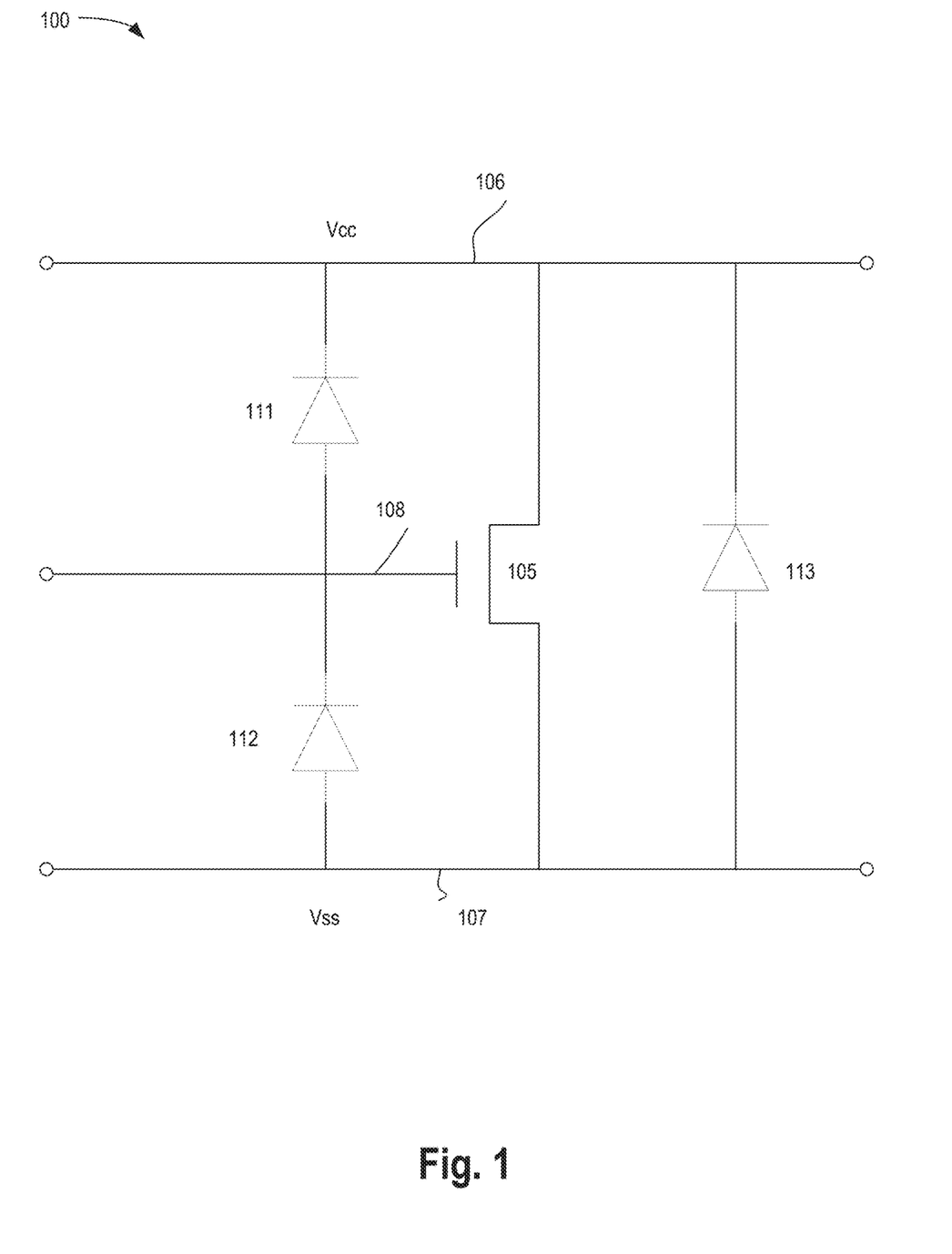
FIG. 1 is a schematic of a diode protection circuit, in accordance with some embodiments.

FIG. 1 is schematic of an electrical circuit 100 suitable for implementing at least one III-N heterojunction diode as further described below. Circuit 100 can be implemented as a single IC chip and may be implemented in any electronic device, such as, but not limited to, smartphones, ultrabook computers, embedded devices (e.g., internet of things, automotive applications, etc.), or wearables. In circuit 100, a III-N transistor 105 is to be protected from electrical surges by diodes 111, 112, and 113. Transistor 105 includes a first terminal (e.g., cathode) coupled to a first supply rail 106 maintained at a nominal supply voltage (e.g., $V_{cc}$), and a second terminal (e.g., drain) coupled to second supply rail 107 maintained at a nominal reference voltage (e.g., $V_{ss}$). A third terminal (e.g., gate) of transistor 105 is coupled to a signal input 108, which conveys an input voltage $V_{in}$. In circuit 100, transistor 105 is protected by diodes 111 and 112 connecting signal input 108 to the supply rails 106, 107 (e.g., $V_{cc}$ and $V_{ss}$, respectively), and by diode 113 connecting supply rail 106 to supply rail 107.

Under normal operating conditions, diodes 111, 112 and 113 are maintained in the off-state (e.g., reverse biased) such that signal input 108 is effectively disconnected from supply rails 106, 107 while transistor 105 is driven by the supply voltage across rails 106, 107. However, upon experiencing a potential surge between signal input 108 and supply rails 106 and 107, the transient will forward bias one or more of diodes 111, 112 and 113, turning them on. Which of diodes 111, 112 and 113 become forward biased is dependent on the charge polarity of the surge relative to the supply rail potentials. Charge accumulated at voltage input 108 is thereby dissipated or shunted through the diode path around transistor 105. In accordance with some embodiments, one or more diodes of a protection circuit (e.g., diodes 111, 112 and 113) employ a II-N heterostructure further employed by transistor 105. One or more of diodes 111, 112, 113 may be thereby vertically integrated monolithically with transistor 105, reducing the IC footprint of the integrated device. Such transistor-diode integrated device structures may have one or more of the features described further below. Any of the III-N heterostructure integrated devices described further herein may also be employed in any other suitable protection circuit designs. Any of the III-N heterostructure integrated devices described further herein may also be employed in circuits having functions other than ESD protection, such as, but not limited to, high voltage power management circuitry.

Figure 2A:
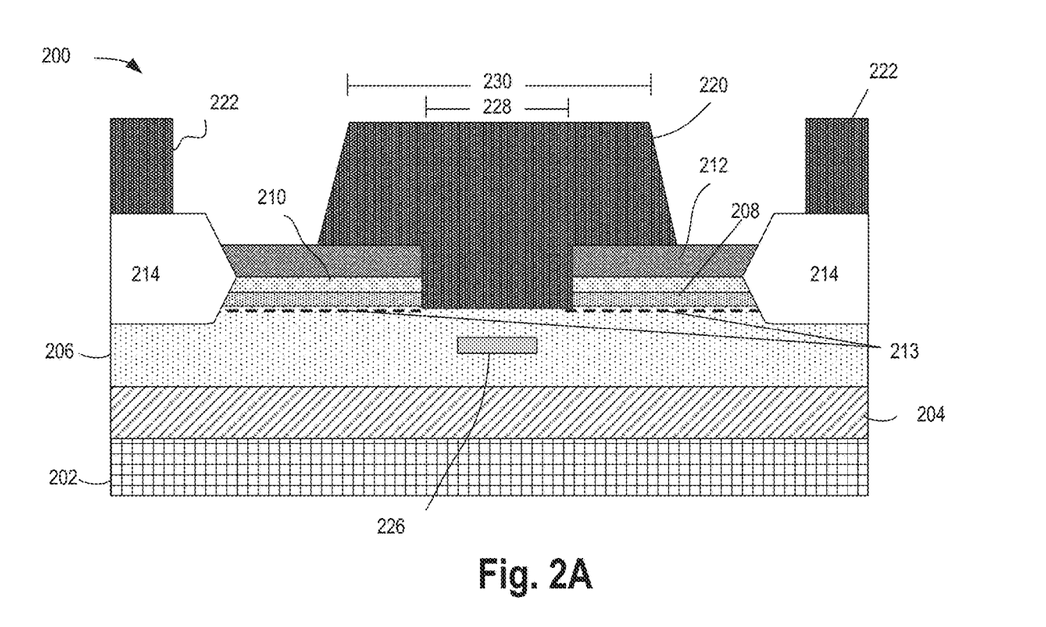
FIGS. 2A and 2B are cross-sectional views of exemplary III-N heterojunction diode structures, in accordance with some embodiments.
Figure 2B:
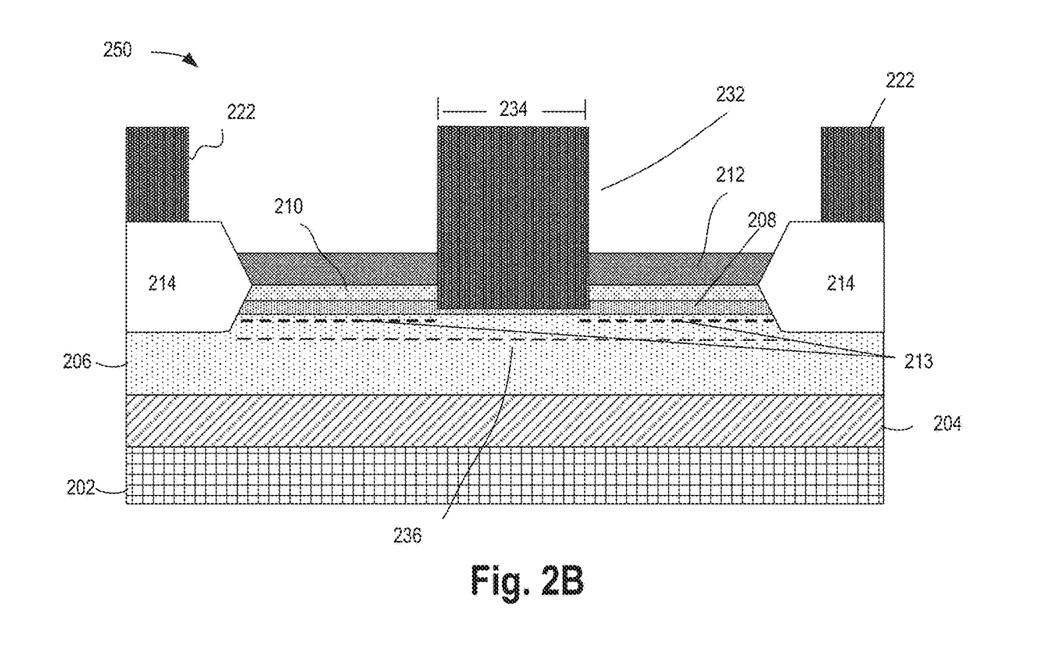

FIGS. 2A and 2B are cross-sectional views of exemplary II-N heterojunction diode structures, in accordance with some embodiments. As shown in FIG. 2A, device 200 may include substrate 202, buffer layer 204, channel layer 206, polarization layer 208, barrier layer 210, capping layer 212, two-dimensional charge carrier sheet 213 (e.g., 2D electron gas or "2DEG"), cathode 214, anode 220, contact metal 222, implant doping layer 226, lower anode width 228, and upper anode width 230. In some embodiments, device 200 may resemble, and use same process technologies as, a high electron mobility transistor (HEMT), but without gate dielectric separating anode 220 from polarization layer 208, for example.

In some embodiments, substrate 202 may be a SiC substrate. In other embodiments, substrate 202 is a cubic semiconductor, such as monocrystalline silicon. For such embodiments, template structures may be formed on a cubic substrate surface, such as a (100) surface. III-N crystals may also be grown on other surfaces (e.g., 110, 111, miscut or offcut, for example 2-10° toward [110] etc.). In some embodiments, substrate 202 may be material upon which the III-N crystal has been bonded, in which case substrate 202 may be crystalline, or not (e.g., glass, polymer, etc.).

Buffer layer 204 may be present to buffer channel layer 206 from substrate 202. In some embodiments, buffer layer 204 may include AlN or AlGaN, or other III-N or other materials chosen to differentiate from the material used for channel layer 206.

In some embodiments, a III-N heterostructure may include channel layer 206, polarization layer 208, and barrier layer 210. Polarization layer 208 comprises an alloy distinct from the alloy of channel layer 206, thereby inducing a variation in the polarization field strength (e.g., spontaneous and/or piezoelectric) between these two III-N layers. Where spontaneous and/or piezoelectric polarization field strengths are sufficiently different between polarization layer 208 and III-N channel layer 206, 2DEG 213 is formed within channel layer 206 in the absence of any externally applied field.

For some exemplary embodiments having Ga-polarity, polarization layer 208 has a higher Al content than III-N channel layer 206. Polarization layer 208 may be binary AlN. Polarization layer 208 may also be an AlGaN alloy. Exemplary AlGaN embodiments include 25-40% Al ($Al_xGa_{1-x}N$ where $0.25 \leq x \leq 0.4$). Polarization layer 208, or barrier layer 210, may also be an InAlN alloy or a quaternary alloy, which are also suitable as a polarization material and may offer advantages with respect to tuning the lattice constant to better match that of one or more other material layers (e.g., layers 206 and/or 210). Exemplary MAlN embodiments include less than 20% In ($In_xA_{1-x}N$ where $0 < x \leq 0.2$), with 17% In having the advantage of an exceptional lattice match with binary GaN. Exemplary quaternary alloys include $In_xGa_yA_{1-x-y}N$ with $0 < x \leq 0.2$ and $0 < y \leq 0.2$.

In some embodiments, III-N channel layer 206 may be binary GaN. III-N channel layer 206 may also be an AlGaN or InAlN alloy, or even a quaternary alloy, as long as the polarization field strength difference between layers 206 and 208 is sufficient to induce formation of 2DEG 213.

In some advantageous embodiments, at least III-N channel layer 206 is intrinsic and not intentionally doped with impurities associated with a particular conductivity type. Channel layer 206 in the intrinsic state can be expected to have higher charge carrier mobility than is possible for a material of higher impurity doping. Intrinsic impurity (e.g., Si) levels in channel layer 206 are advantageously less than 1e17 atoms/cm$^3$, and in some exemplary embodiments is between 1e14 and 1e16 atoms/cm$^3$. In the example illustrated in FIG. 2A, channel layer 206 includes implant doping layer 226, which may include silicon doping for an increased presence of charge carriers.

In some embodiments, capping layer 212 may be included over barrier layer 210, while in other embodiments, capping layer 212 is not present. In some embodiments, where present, capping layer 212 may include dielectric material, such as an oxide, or another III-N material, for example.

Anode 220 may be formed in a recess extending through two or more III-N heterostructure layers. As shown, anode 220 may contact channel layer 206. In some embodiments, anode 220 may include lower anode width 228 within a III-N heterostructure recess and upper anode width 230 over the III-N heterostructure. The degree to which upper anode width 230 overhangs the III-N heterostructure may be adjusted for a desired capacitance.

The composition of anode 220 may be selected based on the metal-semiconductor workfunction difference relative to III-N channel layer 206 to achieve a desired transistor threshold voltage. In some embodiments, where III-N channel layer 206 is binary GaN, anode 220 advantageously includes at least one of Ni, W, Pt, or TiN. Each of these metals or metallic compounds may be associated with a particular work function (or metal-semiconductor work function difference) that has an impact transistor threshold voltage. Although anode 220 is illustrated as homogeneous, a stack or laminate of metals may also be employed.

As shown in FIG. 2A, cathode 214 is within recesses in the III-N heterostructure that are located on opposite sides of anode 220. The cathode recess also extends through III-N barrier layer 210, and polarization layer 208, landing on III-N channel layer 206. In the illustrated example, cathode 214 is in physical contact with a c-plane (e.g., Ga-face) of III-N channel layer 206. Cathode 214 has access to an edge thickness of 2DEG 213 buried below the heterojunction between polarization layer 208 and III-N channel layer 206. One skilled in the art would appreciate that a direct (or substantially direct) connection between 2DEG 213 and cathode 214 would to tend to reduce on resistance of the associated Schottky diode, thereby enhancing ESD protection. The junction between III-N channel layer 206 and cathode 214 may be a heterojunction with the composition of cathode 214 being distinct from that of at least III-N channel layer 206. In some embodiments, cathode 214 is also a III-N material. For example, cathode 214 may be InGaN. Some advantageous InGaN embodiments include 5-20% In ($In_xGa_{1-x}N$ with 5%≤x≤20%). The alloy composition of cathode 214 may be constant or graded between III-N channel layer 206 and contact metal 222. For some embodiments, cathode 214 is epitaxial, having the same crystallinity and orientation as III-N channel layer 206.

Cathode 214 includes impurity dopants to have a first conductivity type (e.g., Si donor impurities for n-type conductivity). The doping level of cathode 214 is advantageously as high as practical for lowest transistor terminal resistance. In some exemplary embodiments where cathode 214 is a III-N alloy, the impurity dopant level is over 1e19 atoms/cm$^3$, and more advantageously over 1e20 atoms/cm$^3$. Si is one exemplary dopant atom for which such high (N+) doping levels may be achieved in III-N alloys. An alternative N-type dopant is Ge.

For embodiments where cathode 214 has n-type conductivity, contact metal 222 may be any suitable metal, such as at least one of Ti, Al, or W, for example. Other metals known to make ohmic contacts to n-type III-N materials may be suitable alternatives for making ohmic contact to cathode 214.

As shown in FIG. 2B, device 250 may represent an alternative embodiment that may include anode 232. Anode 232 may have a substantially constant width 234 and may reside in a recess that only partially extends through polarization layer 208. In some embodiments, anode 232 may be separated from channel layer 206 by about a 1-3 nm portion of polarization layer 208. Also, device 250 may include delta doping layer 236, instead of or in addition to implant doping layer 226, which may increase the presence of charge carriers by introducing dopants, such as silicon, during the epitaxial growth of channel layer 206.

Figure 3:
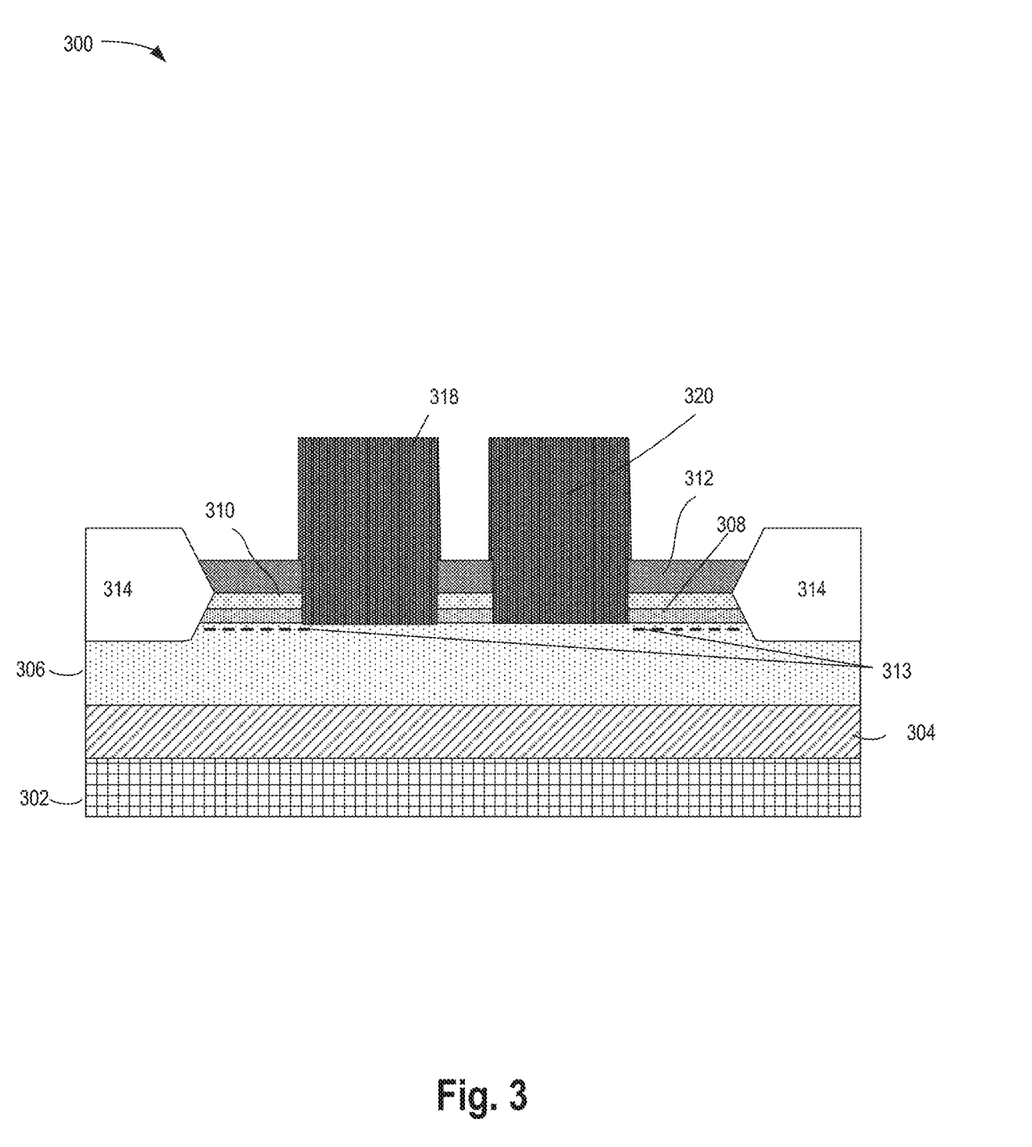
FIG. 3 is a cross-sectional view an exemplary III-N heterojunction diode structure, in accordance with some embodiments.

FIG. 3 is a cross-sectional view an exemplary III-N heterojunction diode structure, in accordance with some embodiments. As shown in FIG. 3, device 300 may include substrate 302, buffer layer 304, channel layer 306, polarization layer 308, barrier layer 310, capping layer 312, 2DEG 313, cathode 314, first anode 318, and second anode 320. Device 300 may include many of the same features previously presented in reference to devices 200 and 250. In some embodiments, device 300 includes first anode 318 and second anode 320 to provide additional Schottky barriers that could enable device 300 to function as a back-to-back Schottky. While shown as being analogous, first anode 318 and second anode 320 may differ in composition of dimensions. For example, first anode 318 may include a larger or smaller overhang over the III-N heterostructure than second anode 320.

Figure 4A:
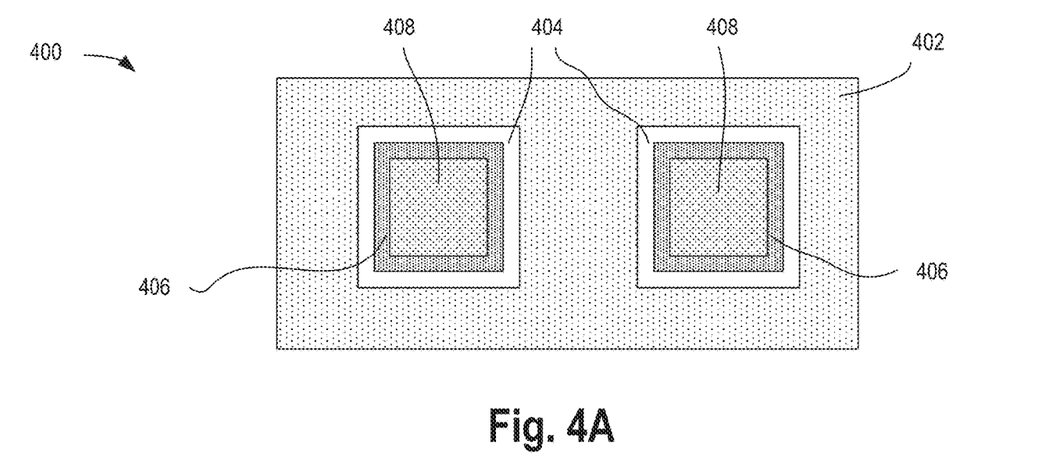
FIGS. 4A, 4B, and 4C illustrate plan views of exemplary III-N heterojunction diode structures, in accordance with some embodiments.
Figure 4B:
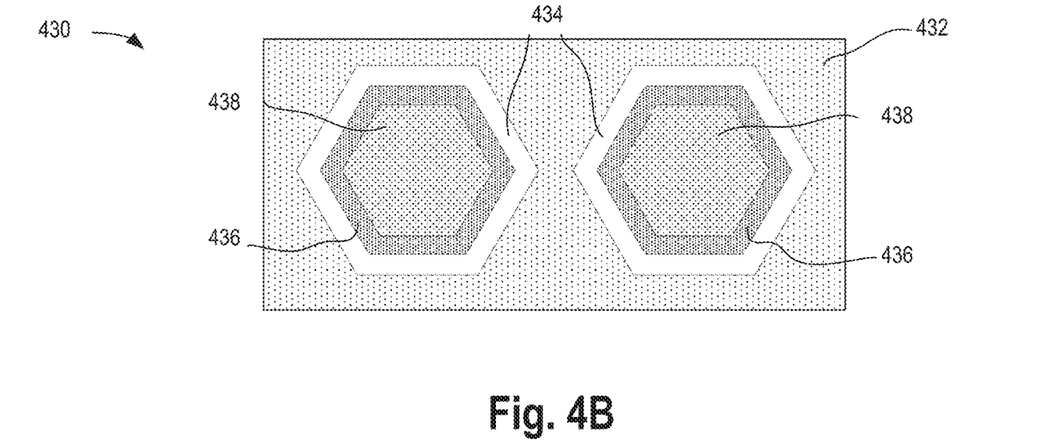
Figure 4C:
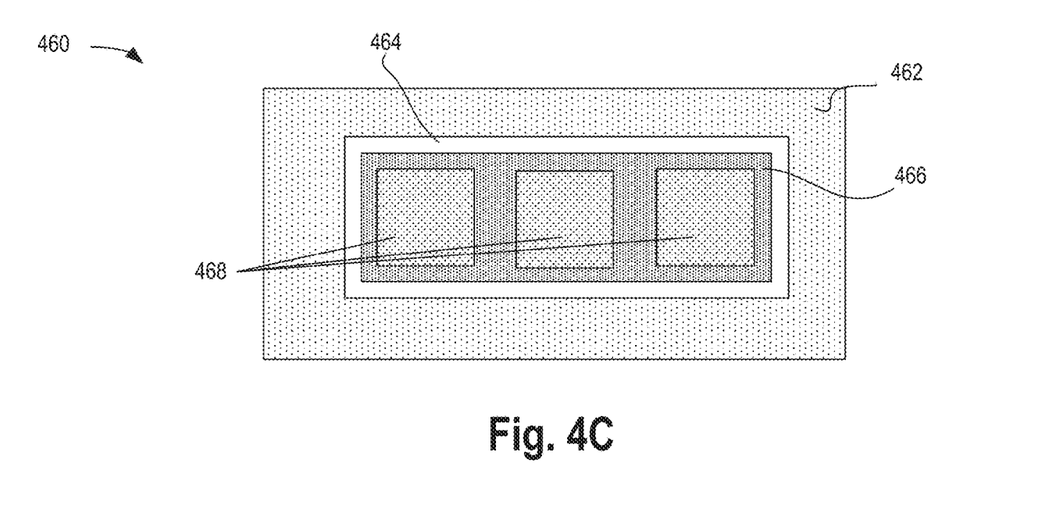

FIGS. 4A, 4B, and 4C illustrate plan views of exemplary III-N heterojunction diode structures, in accordance with some embodiments. As shown in FIG. 4A, diode structure 400 includes cathode 402, 2DEG 404, anodes 406, and Schottky junctions 408. Diode structure 400 may include aspects of previous devices presented herein, for example including III-N heterostructures. 2DEG 404 may be induced between two or more layers of III-N heterojunction material, for example as in device 200. In some embodiments, anodes 406 may be analogous to an anode from previous devices and may overhang over a heterostructure surface, for example as in device 200. Schottky junctions 408 may represent metal/semiconductor interfaces below anodes 406. While shown as having four outer sides, anodes 406 may have fewer or more sides. In some embodiments, cathode 402 is substantially (within about 10%) equidistant from each of the outer sides of anode 406.

As shown in FIG. 4B, diode structure 430 includes cathode 432, 2DEG 434, anodes 436, and Schottky junctions 438. While anodes 436 may have rounded outer sides, for example a circular shape, it may be more difficult to manufacture and a polygonal shape with six or more sides may be more practicable. As shown in FIG. 4C, diode structure 460 includes cathode 462, 2DEG 464, anode 466, and Schottky junctions 468. While shown as having three Schottky junctions 468, in various embodiments anode 466 may have any number of Schottky junctions.

Figure 5:
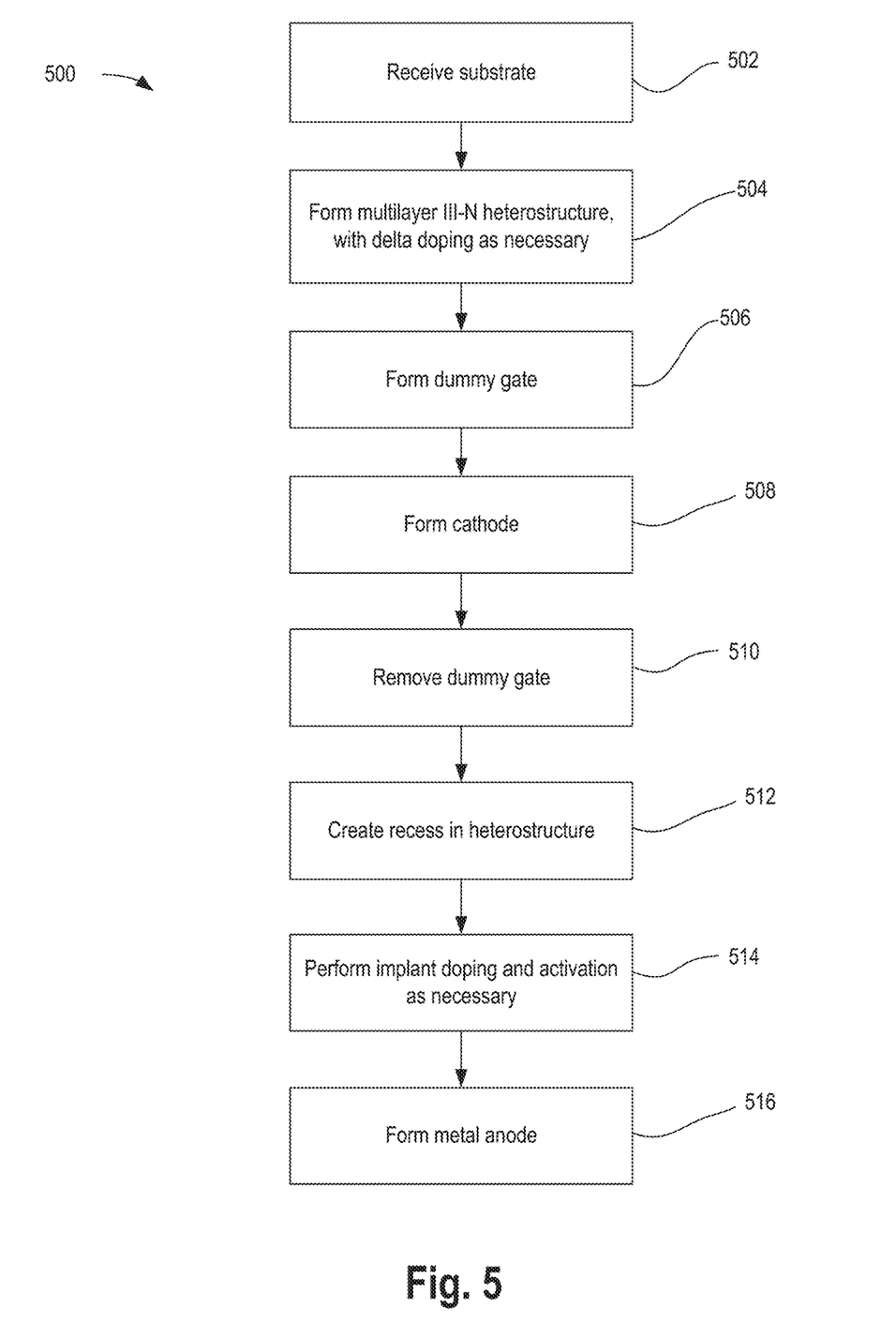
FIG. 5 is a flow diagram illustrating methods of forming III-N heterojunction diode structures, in accordance with some embodiments.

The III-N devices described above may be fabricated using a variety of methods. FIG. 5 is a flow diagram illustrating methods 500 for forming III-N Schottky diodes, in accordance with some embodiments. Methods 500 begin at operation 502 where a substrate including a crystalline seed layer is received. The substrate received at operation 502 may be any of those described above, for example. At operation 504, a III-N epitaxial growth process is employed to grow a crystalline Ga-polar III-N heterostructure on the substrate seeding surface. The heterostructure grown induces the formation of a 2D charge carrier sheet. In some embodiments, delta doping is included in the epitaxial growth of a channel layer. The epitaxial growth performed at operation 504 may form a continuous crystal over an entire surface of a substrate, or may be limited to islands or mesas occupying only a portion of a substrate surface as controlled through a templating pattern. Alternatively, a Ga-face of a III-N crystal grown with any polarity is exposed at operation 504. For example, a III-N crystal may be first grown with N-polarity over a substrate, and the substrate then removed to expose the Ga-face to subsequent processing.

At operation 506, a dummy gate may be formed by any suitable method to define a location for an eventual anode. In some embodiments, a poly-silicon dummy gate may be formed. Methods 500 continue at operation 508 where cathode semiconductor is formed in a manner that ensures the cathode semiconductor is coupled to the 2D charge carrier sheet present within the heterostructure. The formation process may further entail forming a recess through layers of the III-N heterostructure and deposition or growth of semiconductor within the recess. Any patterning techniques may be employed to form the recess and any epitaxial growth technique or deposition process may be employed, for example to form any of the cathode semiconductor compositions described above.

Methods 500 continue at operation 510 where the dummy gate may be removed by any etch or ablation techniques. At operation 512, a recess may be created in the heterostructure in which the anode will be formed and implant doping and activation may be performed (operation 514). Methods 500 conclude at operation 516 where an anode is formed in a manner that ensures the anode will be coupled (e.g., with rectification) to the 2D charge carrier sheet. Any deposition process(es) suitable for the chosen anode may be employed. For example, one or more of physical vapor deposition, chemical vapor deposition, or atomic layer deposition may be employed to deposit one or more the metal or metallic compound, such as any of those described elsewhere herein.

Figure 6:
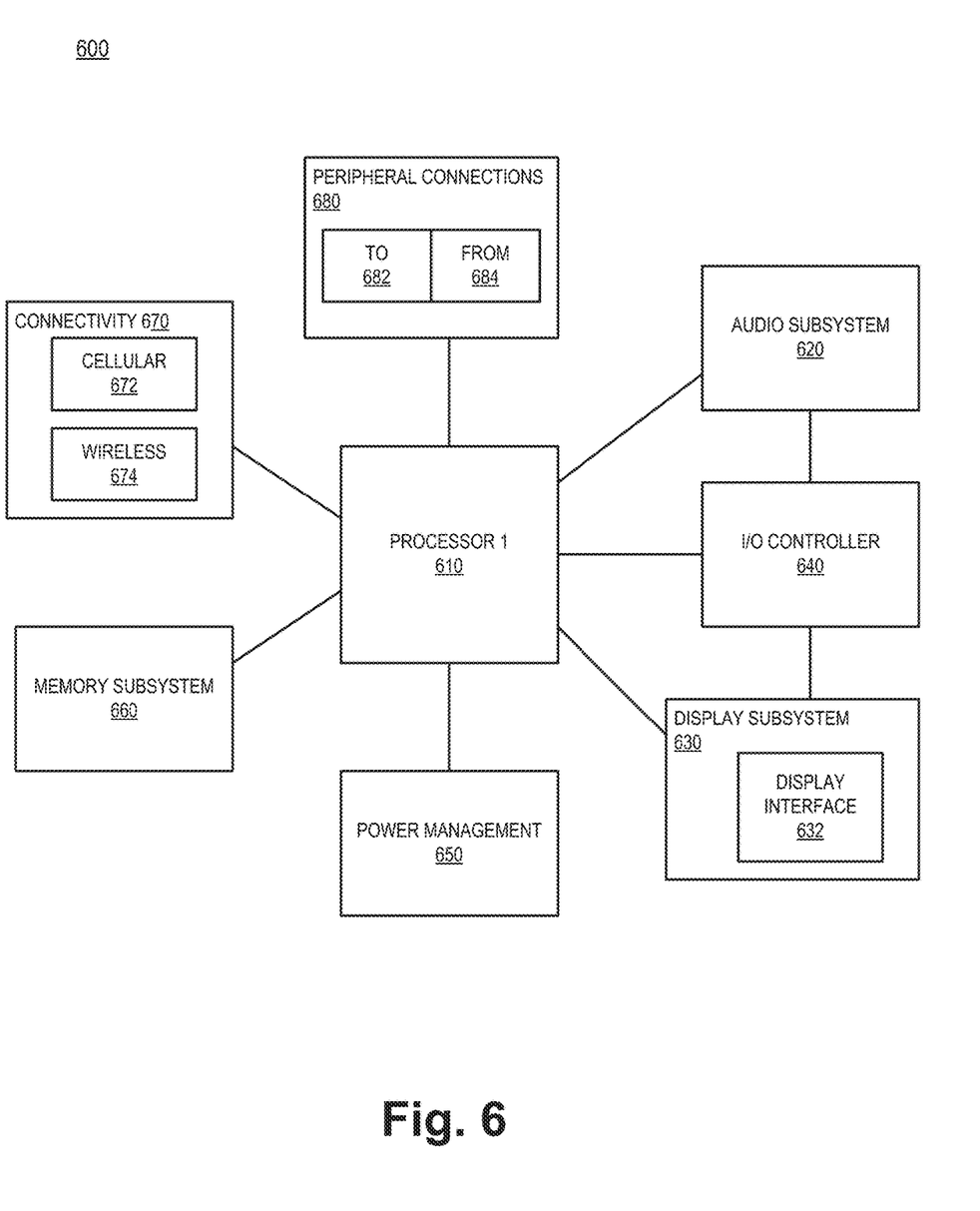
FIG. 6 illustrates a smart device or a computer system or a SoC (System-on-Chip) which includes a III-N heterojunction diode structure, in accordance with some embodiments.

FIG. 6 illustrates a smart device or a computer system or a SoC (System-on-Chip) which includes a III-N heterojunction diode structure, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example cellular 672 and/or wireless 674, include a III-N heterojunction diode structure as described above, for example coupled with a transceiver.

For purposes of the embodiments, the transistors in various circuits and logic blocks described here are metal oxide semiconductor (MOS) transistors or their derivatives, where the MOS transistors include drain, cathode, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical cathode and drain terminals i.e., are identical terminals and are interchangeably used here. A TFET device, on the other hand, has asymmetric Cathode and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other IO devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks. CD-ROMs, DVD ROMs, RAMs. EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could be both a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one example, a Group III-Nitride (III-N) device structure is provided comprising: a heterostructure having three or more layers comprising III-N material; an anode within a recess that extends through two or more of the layers, wherein the anode is in electrical contact with the first layer; a cathode comprising donor dopants, wherein the cathode is on the first layer of the heterostructure; and a conducting region in the first layer in direct contact to the cathode and conductively connected to the anode.

In some embodiments, the conducting region in the first layer is formed by polarization fields of a second layer. In some embodiments, a Schottky barrier is formed between the conducting region in the first layer and the anode. In some embodiments, the conducting region in the first layer extents below the anode. In some embodiments, the conducting region in the first layer below the anode is formed by polarization fields of the second layer extending below the anode, while the thickness of the portion of the second layer below the anode is reduced compared to the thickness of the portion of the second layer extending between anode and cathode.

In some embodiments, the first layer of the heterostructure comprises GaN and a second layer of the heterostructure comprises AlN. Some embodiments also include donor dopants in the first layer of the heterostructure comprising a delta doping layer or an implant doping layer. In some embodiments, the anode is separated from the first layer of the heterostructure by about a 1-3 nm portion of the second layer of the heterostructure. In some embodiments, the anode comprises Ni. Some embodiments also also include a second anode between the cathode. In some embodiments, the anode comprises a first width within the recess and a second width beyond the recess, wherein the second width of the anode comprises an overhang over one or more layers of the heterostructure. In some embodiments, the anode comprises six outer sides.

In another example, a computer platform is provided comprising: one or more transceiver; a processor communicatively coupled to the transceiver; and an antenna coupled to the transceiver, wherein the transceiver is coupled to a III-N device comprising: a heterostructure having three or more layers comprising II-N material, wherein a first layer of the heterostructure comprises donor dopants; an anode within a recess that extends through two or more of the layers, wherein the anode is in electrical contact with the first layer and wherein the anode comprises a first width within the recess and a second width beyond the recess; and a cathode comprising donor dopants, wherein the cathode is on the first layer of the heterostructure and wherein the cathode extends beyond the heterostructure.

In some embodiments, the first layer of the heterostructure comprises GaN and a second layer of the heterostructure comprises AlN. In some embodiments, the donor dopants in the first layer of the heterostructure comprise a delta doping layer or an implant doping layer. In some embodiments, the anode is separated from the first layer of the heterostructure by about a 1-3 nm portion of the second layer of the heterostructure. In some embodiments, the anode comprises Ni. Some embodiments also include a second anode between the cathode.

In another example, a method of forming a Group III-Nitride (III-N) device structure is provided comprising: forming a heterostructure comprising three or more III-N material layers, wherein a first layer of the heterostructure comprises donor dopants; forming a cathode semiconductor on the first layer of the heterostructure, wherein the cathode comprises donor dopants, and wherein the cathode extends beyond the heterostructure; and forming an anode within a recess that extends through two or more of the layers, wherein the anode is in electrical contact with the first layer and wherein the anode comprises a first width within the recess and a second width beyond the recess.

In some embodiments, forming the heterostructure comprising forming the first layer of the heterostructure comprising GaN and forming a second layer of the heterostructure comprising AlN. In some embodiments, forming donor dopants in the first layer of the heterostructure comprises delta doping or an implant doping. In some embodiments, forming the anode comprising forming the anode separated from the first layer of the heterostructure by about a 1-3 nm portion of the second layer of the heterostructure. In some embodiments, forming the anode comprises forming an anode comprising Ni. Some embodiments also include forming a second anode between the cathode. In some embodiments, forming the anode comprises forming an anode comprising six outer sides.

In another example, a system is provided comprising: a display subsystem; a wireless communication interface; and an integrated circuit device, the integrated circuit device comprising: a heterostructure having three or more layers comprising III-N material; an anode within a recess that extends through two or more of the layers, wherein the anode is in electrical contact with the first layer; a cathode comprising donor dopants, wherein the cathode is on the first layer of the heterostructure; and a conducting region in the first layer in direct contact to the cathode and conductively connected to the anode.

In some embodiments, the conducting region in the first layer is formed by polarization fields of a second layer. In some embodiments, a Schottky barrier is formed between the conducting region in the first layer and the anode. In some embodiments, the conducting region in the first layer extents below the anode. In some embodiments, the conducting region in the first layer below the anode is formed by polarization fields of the second layer extending below the anode, while the thickness of the portion of the second layer below the anode is reduced compared to the thickness of the portion of the second layer extending between anode and cathode. In some embodiments, the first layer of the heterostructure comprises GaN and a second layer of the heterostructure comprises AlN. In some embodiments, the first anode region comprises high k dielectric material on three sides of the anode. Some embodiments also include donor dopants in the first layer of the heterostructure, wherein the donor dopants comprise a delta doping layer or an implant doping layer.

However, the above embodiments are not limited in this regard and, in various implementations, the above embodiments may include the undertaking only a subset of such of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A Group III-Nitride (III-N) device structure comprising:
   a heterostructure having three or more layers comprising III-N material;
   an anode that extends through two or more of the layers, wherein the anode comprises a metal in electrical contact with a first of the layers;
   a cathode comprising an N-type III-N material comprising donor dopants, wherein the N-type III-N material extends through two or more of the layers and into at least a portion of the first layer of the heterostructure, and wherein the N-type III-N material comprises In and has a composition distinct from that of the first layer; and
   a conducting region in a portion of the first layer adjacent to the cathode and coupled to the anode.

2. The III-N device structure of claim 1, wherein the conducting region in the first layer is associated with polarization fields of a second of the layers.

3. The III-N device structure of claim 1, wherein a Schottky barrier is between the conducting region in the first layer and the metal.

4. The III-N device structure of claim 1, wherein the conducting region in the first layer extends below the anode.

5. The III-N device structure of claim 1, wherein the first layer of the heterostructure comprises Ga and N and a second layer of the heterostructure comprises Al and N.

6. The III-N device structure of claim 1, further comprising donor dopants in the first layer of the heterostructure comprising a delta doping layer or an implanted doping layer.

7. The III-N device structure of claim 1, wherein the donor dopants have a concentration of at least 1e19 atoms/$cm^3$ within the N-type III-N material.

8. The III-N device structure of claim 1, wherein the metal comprises Ni.

9. The III-N device structure of claim 1, wherein the donor dopants have a concentration of at least 1e20 atoms/$cm^3$ within the N-type III-N material.

10. A computer platform comprising:
    one or more transceivers;
    a processor communicatively coupled to the transceivers; and an antenna coupled to the transceiver, wherein the transceiver is coupled to a III-N device comprising:
    a heterostructure having three or more layers comprising III-N material, wherein a first layer of the heterostructure comprises donor dopants;
    an anode that extends through two or more of the layers, wherein the anode comprises a metal in electrical contact with a first of the layers; and
    a cathode comprising an N-type III-N material comprising donor dopants, wherein the N-type III-N material extends through two or more of the layers and into at least a portion of the first layer of the heterostructure, and wherein the N-type III-N material comprises In and has a composition distinct from that of the first layer.

11. The computer platform of claim 10, wherein the first layer of the heterostructure comprises Ga and N and a second layer of the heterostructure comprises Al and N.

12. The computer platform of claim 10, wherein the metal comprises Ni.

13. A computer platform comprising:
    one or more transceivers;
    a processor communicatively coupled to the transceivers; and
    an antenna coupled to the transceiver, wherein the transceiver is coupled to a III-N device comprising:
        a heterostructure having three or more layers comprising III-N material, wherein a first layer of the heterostructure comprises donor dopants;
        an anode within a recess that extends through two or more of the layers, wherein the anode is in electrical contact with the first layer and wherein the anode comprises a first width within the recess and a second width beyond the recess;
        a cathode comprising donor dopants, wherein the cathode is on the first layer of the heterostructure and wherein the cathode extends beyond the heterostructure; and
        a second anode between the cathode and the anode.

14. A method of forming a Group III-Nitride (III-N) device structure, the method comprising:
    forming a heterostructure comprising three or more III-N material layers, wherein a first layer of the heterostructure comprises donor dopants;
    forming a cathode semiconductor within a first recess that extends through two or more of the layers and at least a portion of the first layer of the heterostructure, wherein forming the cathode semiconductor further comprises introducing the donor dopants to a concentration of at least 1e19 atoms/cm$^3$ within a III-N material comprising In; and
    forming an anode within a second recess that extends through two or more of the layers, wherein the anode comprises a metal in electrical contact with the first layer.

15. The method of claim 14, wherein forming the heterostructure comprises forming the first layer of the heterostructure comprising Ga and N, and forming a second layer of the heterostructure comprising Al and N directly on the first layer.

16. The method of claim 14, wherein forming the anode comprises depositing the metal into the second recess and on a surface of the first layer.

17. The method of claim 14, wherein forming the anode comprises depositing Ni into the second recess.

18. The method of claim 14, wherein forming the anode comprises forming an anode having six outer sides.

* * * * *